United States Patent
Na et al.

(10) Patent No.: US 10,404,270 B2
(45) Date of Patent: Sep. 3, 2019

(54) SEMICONDUCTOR DEVICE AND OPERATING METHOD THEREOF

(71) Applicant: SAMSUNG ELECTRONICS CO., LTD., Suwon-si, Gyeonggi-do (KR)

(72) Inventors: Seung In Na, Seoul (KR); Da Som Park, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 16/013,985

(22) Filed: Jun. 21, 2018

(65) Prior Publication Data
US 2019/0199367 A1  Jun. 27, 2019

(30) Foreign Application Priority Data

Dec. 6, 2017 (KR) .......................... 10-2017-0166803

(51) Int. Cl.
*H03M 1/14* (2006.01)
*H03M 1/46* (2006.01)
*H03M 3/00* (2006.01)

(52) U.S. Cl.
CPC ............. *H03M 3/46* (2013.01); *H03M 1/145* (2013.01); *H03M 1/462* (2013.01); *H03M 3/446* (2013.01); *H03M 3/424* (2013.01)

(58) Field of Classification Search
None
See application file for complete search history.

(56) References Cited

U.S. PATENT DOCUMENTS

| | | |
|---|---|---|
| 6,195,032 B1 | 2/2001 | Watson et al. |
| 6,271,782 B1 * | 8/2001 | Steensgaard-Madsen ................... H03M 3/416 341/143 |
| 6,313,775 B1 | 11/2001 | Lindfors et al. |
| 6,459,400 B1 | 10/2002 | Steinbach |
| 6,940,436 B2 | 9/2005 | Hezar et al. |
| 8,618,975 B2 | 12/2013 | Nys et al. |

(Continued)

FOREIGN PATENT DOCUMENTS

| | | |
|---|---|---|
| JP | 2013058972 A | 3/2013 |
| KR | 1583292 | 12/2015 |
| KR | 1645571 B1 | 8/2016 |

OTHER PUBLICATIONS

Youngcheol Chae et al., "A 6.3 µW 20 bit Incremental Zoom-ADV with 6 ppm INL and 1 µV Offset," IEEE Journal of Solid-State Circuits (vol. 48, Issue: 12, Dec. 2013), pp. 3019-3027.

(Continued)

*Primary Examiner* — Howard Williams
(74) *Attorney, Agent, or Firm* — Volentine, Whitt & Francos, PLLC

(57) ABSTRACT

A semiconductor device includes; a loop filter that receives a differential analog signal and generates a residue signal indicating an error between an analog input signal and an feedback signal, a first ADC that receives the residue signal and generates a first digital representation, a second ADC that receives the analog input signal and generates a second digital representation corresponding to the analog input signal, and a digital to analog converter (DAC) that receives a sum of the first digital representation and the second digital representation and generates the analog feedback signal. At least the first ADC is a multi-bit Successive Approximation Register ADC.

20 Claims, 7 Drawing Sheets

(56) References Cited

U.S. PATENT DOCUMENTS

| | | | |
|---|---|---|---|
| 9,178,529 B2 | 11/2015 | Dong et al. | |
| 9,219,492 B1 | 12/2015 | Lok et al. | |
| 9,325,340 B2 * | 4/2016 | Gonen | H03M 1/14 |
| 9,419,642 B1 * | 8/2016 | Nguyen | H03M 3/42 |
| 9,467,161 B1 | 10/2016 | Kim et al. | |
| 2016/0269045 A1 | 9/2016 | Srinivasan et al. | |
| 2017/0077937 A1 | 3/2017 | Shu | |
| 2017/0179975 A1 | 6/2017 | Dong et al. | |
| 2019/0097648 A1 * | 3/2019 | Sim | H03M 3/464 |

OTHER PUBLICATIONS

Burak Gonen et al, "A 1.65mW 0.16mm2 Dynamic Zoom-ADC with 107.5dB DR in 20kHz BW," ISSCC 2016/Session 15/Oversampling Data Converters/ 15.7/ Feb. 2, 2016, pp. 282-284.
Burak Gonen et al., "A Dynamic Zoom ADV With 109-dB DR for Audio Applications," IEEE Journal of Solid-State Circuits, vol. 52, No. 6, Jun. 2017, pp. 1542-1550.
Ahmed Gharbiya et al., "A 12-bit 3125 MHz Bandwidth 0-3 MASH Delta-Sigma Modulator," IEEE Journal of Solid-State Circuits, vol. 44, No. 1 Jul. 2009, pp. 2010-2018.

\* cited by examiner

CON: Conversion data timing
Hold: holding conversion data
RES: Residue holding

SEMICONDUCTOR DEVICE AND OPERATING METHOD THEREOF

PRIORITY

This application claims the benefit of Korean Patent Application No. 10-2017-0166803 filed on Dec. 6, 2017, the subject matter of which is hereby incorporated by reference.

BACKGROUND

1. Field of the Disclosure

The inventive concept relates to semiconductor devices and operating method(s) for semiconductor devices. More specifically, the inventive concept relates to a semiconductor device which converts an analog signal into a digital signal, and an operating method thereof.

2. Description of the Related Art

In many electronic devices, one or more analog signal(s) is converted into corresponding digital signal(s). For example, measuring apparatuses that perform measurement using a sensor provide an analog signal an analog-to-digital converter (ADC) that converts the analog signal into a corresponding digital signal for subsequent processing. Examples of sensors include a temperature sensor, a humidity sensor, a pressure sensor, a microphone, a radio receiver, a digital measuring device, and the like.

Many measuring apparatuses require high resolution, and therefore a delta-sigma modulator may be used. The delta-sigma modulator has an advantage of being able to convert an analog signal into a corresponding digital signal with low cost and high resolution. In general, a delta-sigma ADC encodes the analog signal using the delta-sigma modulator, and then applies a digital filter to the output of the delta-sigma modulator to generate a high-resolution digital output.

The delta-sigma modulator generally includes a loop filter for an error feedback. The delta-sigma modulator has a noise shaping function of moving the quantization noise to a high frequency band.

SUMMARY

An aspect of the inventive concept provides a semiconductor device which converts an analog signal into a digital signal with reduced power consumption and improved operation stability.

Another aspect of the inventive concept provides a method of operating a semiconductor device which converts an analog signal into a digital signal with reduced power consumption and improved operation stability.

The aspects of the inventive concept area not limited to those mentioned above, and other aspects not mentioned will be clearly understood by a person skilled in the art from the description below.

According to an aspect of the disclosure, there is provided a semiconductor device including; a loop filter that receives a differential analog signal and generates a residue signal indicating an error between an analog input signal and an feedback signal, a first analog to digital converter (ADC) that receives the residue signal and generates a first digital representation, a second ADC that receives the analog input signal and generates a second digital representation corresponding to the analog input signal, and a digital to analog converter (DAC) that receives a sum of the first digital representation and the second digital representation and generates the analog feedback signal, wherein the first ADC is a multi-bit Successive Approximation Register ADC using a first step voltage.

According to an aspect of the disclosure, there is provided a semiconductor device including; a first node that performs a subtract operation between an analog input signal and a feedback signal to generate a differential analog signal, a second node that performs an addition operation on a first digital representation and a second digital representation, a digital to analog converter (DAC) that generates the feedback signal from an output of the second node, a gain block that performs an amplification operation on the differential analog signal, a first integrator that performs a first integral operation on the amplified differential analog signal to generate a first integrated result, a first filter that performs a first filter operation on the first integrated result, and a second filter that performs a second filter operation on the first integrated result, a first sub-node node that performs an addition operation on an output of the first filter and an output of the second filter, a second integrator that performs a second integral operation of an output of the first sub-node to generate a second integrated result, and a fine analog to digital converter (ADC) that generates the first digital representation from the second integral result.

According to an aspect of the disclosure, there is provided a method of operating a semiconductor device. The method includes; generating a residue signal indicating an error between an analog input signal and a feedback signal using a loop filter that receives a differential analog signal, generating a first digital representation from the residue signal using a first analog to digital converter (ADC), generating a second digital representation from the analog input signal using a second ADC, and generating the feedback signal using a digital to analog converter (DAC) that receives a sum of the first digital representation and the second digital representation, wherein the first ADC is a multi-bit Successive Approximation Register ADC using a first step voltage.

BRIEF DESCRIPTION OF THE DRAWINGS

The above and other aspects and features of the inventive concept will become more apparent by describing in detail example embodiments thereof with reference to the attached drawings, in which.

DETAILED DESCRIPTION

Figure 1:
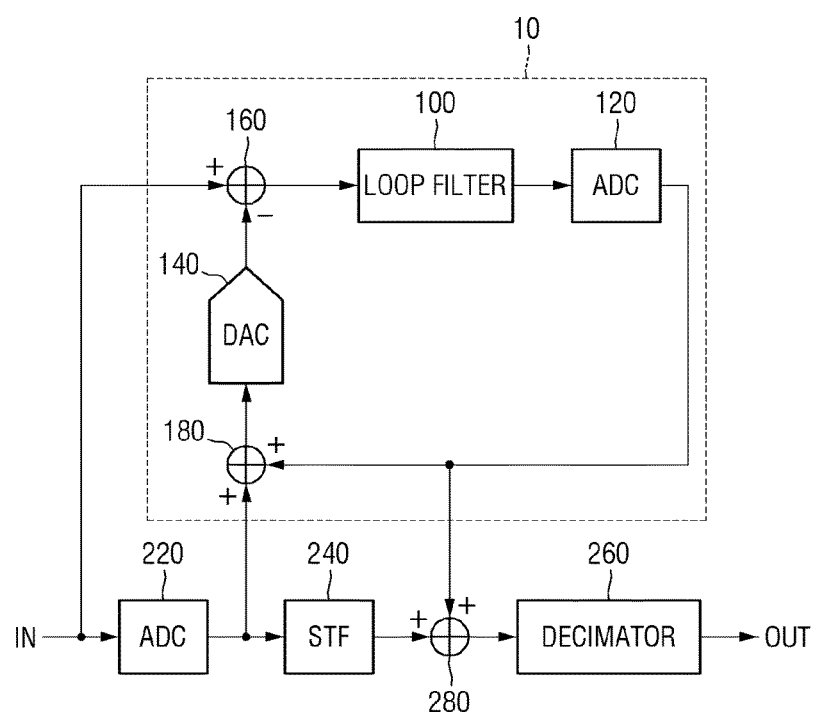
FIG. 1 is a block circuit diagram illustrating a semiconductor device according to embodiments of the inventive concept.

FIG. 1 is a block circuit diagram illustrating relevant portion(s) of a semiconductor device 1 according to embodiments of the inventive concept.

Here, the semiconductor device 1, possibly among other signal processing operations, receives an analog input signal (IN) and converts the analog input signal into a corresponding final digital output (OUT). More particularly, the embodiment illustrated in FIG. 1 includes a multi-stage noise shaping (MASH) Analog-to-Digital Converter (ADC).

The MASH ADC of FIG. 1 may be understood as including a front-end and a back-end. The front-end digitizes the analog input signal, while the back-end digitizes an error signal indicating a difference between a front-end output and the analog input signal (front-end error). In this context, the term "digitizes" means using one or more signal processing operation(s) to generate a digital output signal (digital representation) corresponding to at least one analog signal. MASH ADCs like the one illustrated in FIG. 1 are vulnerable to the potentially adverse influence of coefficient error(s). However, a higher-order, front-end modulator may be used to mitigate this vulnerability. Further, a feedback type, front-end modulator may be used to better ensure signal stability.

The term "0-L MASH ADC" commonly refers to configurations wherein a Nyquist ADC is used as the front-end. Thus, the 0-L MASH ADC does not include a loop filter as part of the front-end, and a back-end delta-sigma modulator may be used to digitize the front-end error. The semiconductor device 1 may be the 0-L MASH ADC, but the scope of the inventive concept is not limited thereto.

Referring to FIG. 1, the semiconductor device 1 includes a delta-sigma modulator 10, a second ADC 220, and may further include a Signal Transfer Function (STF) block 240 and a decimator 260.

In operation, the second ADC 220 receives the analog input signal, and outputs a second digital signal (or a "second digital representation") corresponding to the analog input signal. In other words, the second ADC 220 outputs an approximate digital representation for the analog input signal.

Certain coarse-fine ADC architectures are designed to reduce power consumption while maintaining a high signal resolution. Coarse-fine ADCs are so named because they generally include a coarse ADC and a fine ADC. The coarse ADC uses a first step voltage to detect a particular section of an input signal. In this context, the term "section" refers to an arbitrary portion of the input signal. For example, the input signal may include a sequence of arbitrarily designated sections ( . . . P−1, P, P+1, . . . ). Thus, assuming a particular period designated 'P', the second digital representation provided by the second ADC 220 is an approximate digital representation for P, and a "residue" obtained by subtracting P from the analog input signal using a Digital-to-Analog Converter (DAC) to generate a corresponding input (or feedback signal) to the fine ADC.

The fine ADC may use a second step voltage, less than or equal to the first step voltage. The fine ADC essentially receives the residue signal and outputs a first digital signal (or a "first digital representation") corresponding to the residue signal provided to the first ADC 120. This approach will be described in some additional detail hereafter.

Consistent with the foregoing, the second ADC 220 shown in FIG. 1 may be a coarse ADC and the first ADC 120 may be a fine ADC. The second digital representation provided by the coarse ADC may be digitally signal-processed with the first digital representation provided by the fine ADC in order to generate a final digital output.

In some embodiments of the inventive concept, the second ADC 220 may be implemented as a Successive Approximation Register (SAR) ADC. In particular, the second ADC 220 may be a multi-bit SAR ADC, which enjoys relatively low power consumption. However, since the resolution of SAR ADC is generally only about 12 bits, the SAR ADC is not suitable for high-resolution operating environments. In contrast, delta-sigma modulators having resolutions of 20 bits or higher are generally suitable for high-resolution environments, but suffer from relatively high power consumption.

In certain embodiments of the inventive concept, a coarse-fine ADC may include a SAR ADC as the coarse ADC, and a delta-sigma modulator as the fine ADC in order to achieve a balance between power consumption and resolution requirements. Nonetheless, such designs are vulnerable to process consistency and physical noise issues. For example, when the respective size(s) of the least significant bits for a coarse ADC and a fine ADC in a course-fine ADC are substantially different, error(s) may occur and resolution reduced.

In one embodiment the delta-sigma modulator 10 of FIG. 1 includes a loop filter 100, as well as the first ADC 120 and DAC 140. The loop filter 100 receives a differential analog signal indicating an error between the analog input signal (IN) and the feedback signal provided by DAC 140. One possible embodiment of the loop filter 100 will be described hereafter with reference to FIG. 2.

The first ADC 120 outputs the first digital representation signal which is a digital signal corresponding to the differential analog signal after passing through the loop filter 100. The first digital representation signal is commonly provided to a second node 180 and a third node 280.

The second node 180 adds the second digital representation signal provided by the second ADC 220 to the first digital representation signal provided by the first ADC 120 in order to generate a digital version of the feedback signal which is provided as an input to the DAC 140. The DAC 140 then converts the digital version of the feedback signal into the analog feedback signal and provides the signal to a first node 160, where the first node 160 performs a subtraction operation between the analog input signal (IN) and the feedback signal to generate the differential analog signal passed to the loop filter 100.

The third node 280 adds the first digital representation signal provided by the first ADC 120 to an output signal of the STF block 240. The resulting signal is provided to the decimator 260.

The STF block 240 is a digital signal processing block that receives the second digital representation signal from the second ADC 220 and performs a digital signal process according to a preset characteristic expression. For example, in one embodiment of the inventive concept, the STF block 240 may perform digital signal processing according to the following characteristic expression associated with the second digital representation signal provided by the second ADC 220.

$$STF(z)=2z^{-1}-z^{-2}$$

In this manner, the final digital output (OUT) may be derived in which the result obtained by multiplying the characteristic expression reflecting the signal characteristics of the loop filter 100 by the second digital representation signal provided by the second ADC 220 is added to the first digital representation signal provided by the first ADC 120 is applied as an input to a decimator 260.

The decimator 260 receives the signal obtained by adding the output of the STF block 240 with the first digital representation provided by the first ADC 120, and generates an output of N-bits, where 'N' is a natural number. In particular, in some embodiments of the inventive concept, 'N' will be greater than or equal to 20.

Within the foregoing configuration, the decimator 260 operates as a digital low-pass filter to suppress high-frequency component(s) of the output signal provided by the sigma delta modulator 10 in order to generate (e.g.,) a 20-bit or greater high resolution code at a low-frequency output rate.

Assuming that the first ADC 120 is a multi-bit SAR ADC having a first step voltage the same as the second step voltage of the second ADC 220 notable advantages are realized, as compared, for example, with configurations wherein the first ADC 120 is a first bit flash ADC.

Although configuring the second ADC 220 as a multi-bit SAR ADC in accordance with certain coarse-fine ADC structures provides low power consumption and high resolution as described above, when the first ADC 120 is a 1-bit flash ADC, an additional circuit is further required to correct a potential error caused by differences in LSB size. For example, in order to correct for this type of error, a circuit multiplying the output signal of the first ADC 120 by 'K', where 'K'>>1, to give redundancy may be required. However, providing a circuit that performs the operation of multiplying by 'K' increases the overall cost and size of the semiconductor device and yields a semiconductor device having relatively high power consumption. In addition, a minimum value for the feedback signal is limited to 'K' in the delta-sigma modulator.

Therefore, by providing the first ADC 120 as a multi-bit SAR ADC, embodiments of the inventive concept avoid these potential problems. Additionally, there are advantages in which the "delta" value corresponding to the input of the delta-sigma modulator 10 is more finely expressed, and by reducing the variation of the voltage level of the circuitry including the integrator provided in the delta-sigma modulator 10, its stability can be improved. Furthermore, overall performance of the filter may be improved or the degree of freedom associated with the selection of the filter coefficient may be enhanced.

Figure 2:
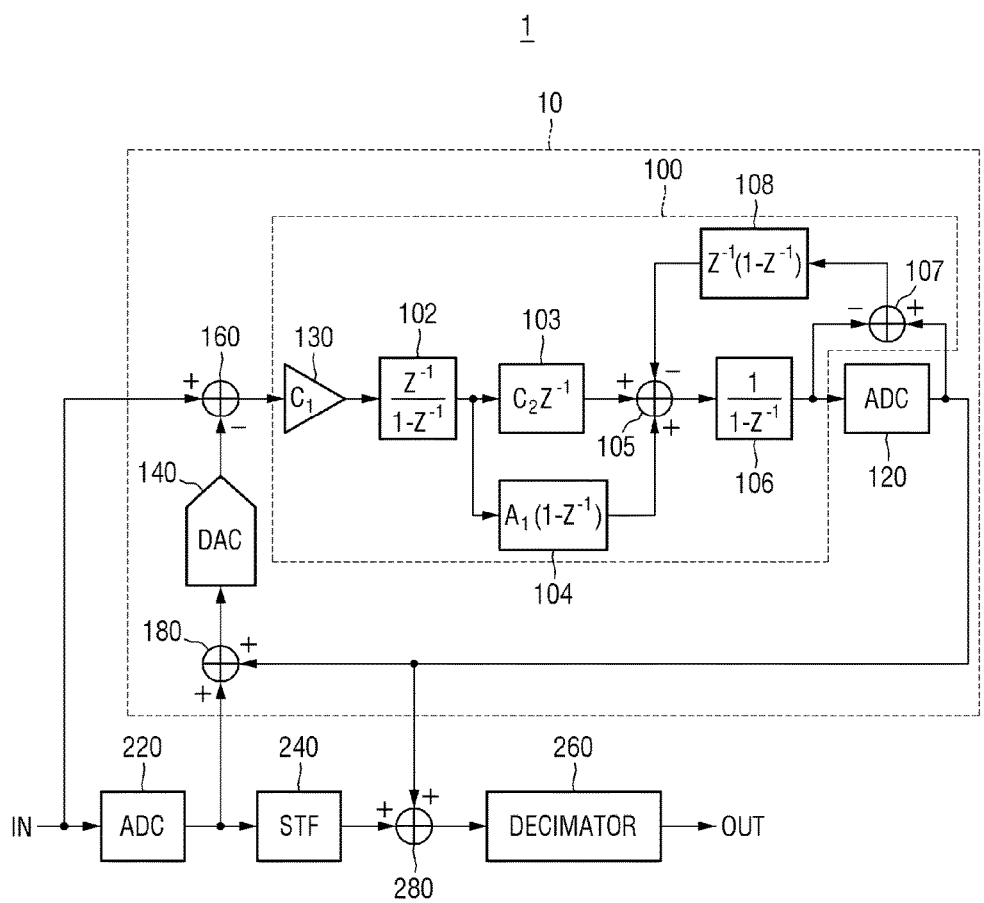
FIG. 2 is a block circuit diagram further illustrating in one embodiment the semiconductor device 1 of FIG. 1.

FIG. 2 is a block circuit diagram further illustrating in one embodiment the semiconductor device 1 according to embodiments of the inventive concept.

Referring to FIG. 2, the delta-sigma modulator 10 of the semiconductor device 1 again includes the loop filter 100, first ADC 120, DAC 140, first node 160 and second node 180.

However, the loop filter 100 is further illustrated as including a gain block 130, a first integrator 102, a first filter 103, a second filter 104, a first sub-node 105, a second integrator 106, a second sub-node 107 and a third filter 108.

The gain block 130 receives the differential analog signal provided by the first node 160, performs a scaling operation, and provides the scaled result to the first integrator 102.

The first integrator 102 receives the scaled result from the gain block 130, performs a first integral operation, and commonly provides the first integrated result to the first filter 103 and the second filter 104. In the illustrated embodiment of FIG. 2, for example, the coefficient(s) of the first integrator 102 may be defined as follows, but the scope of the inventive concept is not limited thereto, and those skilled in the art will recognize that coefficient(s) may be variously defined in accordance with desired purpose(s). However, as one example, $C_1$ may be 1, such that:

$$c_1 \frac{z^{-1}}{1-z^{-1}}$$

Under this assumption, the first filter 103 receives the output provided by the first integrator 102, performs a first filter operation, and provides the result to the first sub-node 105, where $C_2$ may be 1, such that:

The second filter 104 also receives the output provided by the first integrator 102, performs a second filter operation, and provides the result to the first sub-node 105, where $A_1$ may be 2, such that:

$$A_1(1-z^{-1})$$

The first sub-node 105 adds the output of the first filter 103 to the output of the second filter 104 to generate a summation result, and also subtracts an output provided by the third filter 108 (described hereafter) from the summation result, and provides the resulting output to the second integrator 106.

The second integrator 106 receives the output of the first sub-node 105, performs a second integral operation to generate a second integrated result, and provides the second integrated result to the second sub-node 107 and the first ADC 120. In the illustrated embodiment of FIG. 2, the coefficients of the second integrator 106 may be defined as:

$$\frac{1}{1-z^{-1}}$$

The second sub-node 107 subtracts the second integrated result received from the second integrator 106 from the first digital representation provided by the first ADC 120 to generate an output provided to the third filter 108.

The third filter 108 receives the output provided by the second sub-node 107, performs a third filter operation, and provides the result to the first sub-node 105. That is, after the digital conversion performed by the first ADC 120, the third filter 108 performs the third filter operation using a remaining voltage as an input. In one example, the coefficients of the third filter 108 may be:

$$z^{-1}(1-z^{-1})$$

In the illustrated embodiment of FIG. 2, the delta-sigma modulator 10 uses the secondary integration operation provided by the combination of the first integrator 102 and second integrator 106 to provide a noise coupling path including the second sub-node 107, third filter 108 and first sub-node 105 using the residue of the first ADC 120 provided as the multi-bit SAR ADC to manifest tertiary filter characteristics.

Figure 3:
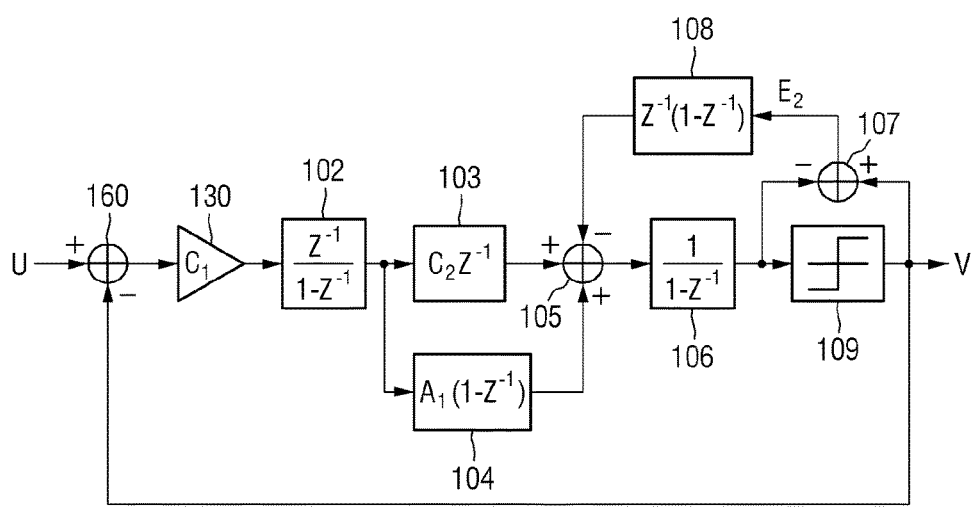
FIG. 3 is a block circuit diagram further illustrating in one embodiment the delta-sigma modulator of FIGS. 1 and 2.

FIG. 3 is a block circuit diagram further illustrating in another embodiment a delta-sigma modulator like the one used in the semiconductor devices of FIGS. 1 and 2 according to embodiments of the inventive concept. The delta-sigma modulator of FIG. 3 replaces ADC 120 with an analog to digital conversion device 109 providing an output 'V' described below, where a Noise Transfer Function (NTF) and a Signal Transfer Function (STF) for the delta-sigma modulator of FIG. 3 may be expressed as:

$$V=(2z^{-1}-z^{-2})U+(1-z^{-1})^3 E_2$$

$$STF(z)=2z^{-1}-z^{-2}$$

$$NTF(z)=(1-z^{-1})^3$$

Here, STF (z) is a characteristic expression provided to the STF block 240. However, since the coefficients of the above characteristic expression include only integers, there is an advantage in which it may be economically provided using only a shifter, a delay, and a subtractor. Further, there is an advantage in which harmonic distortion tone can be removed in the bandwidth of the analog input signal using the STF block 240.

Figure 4:
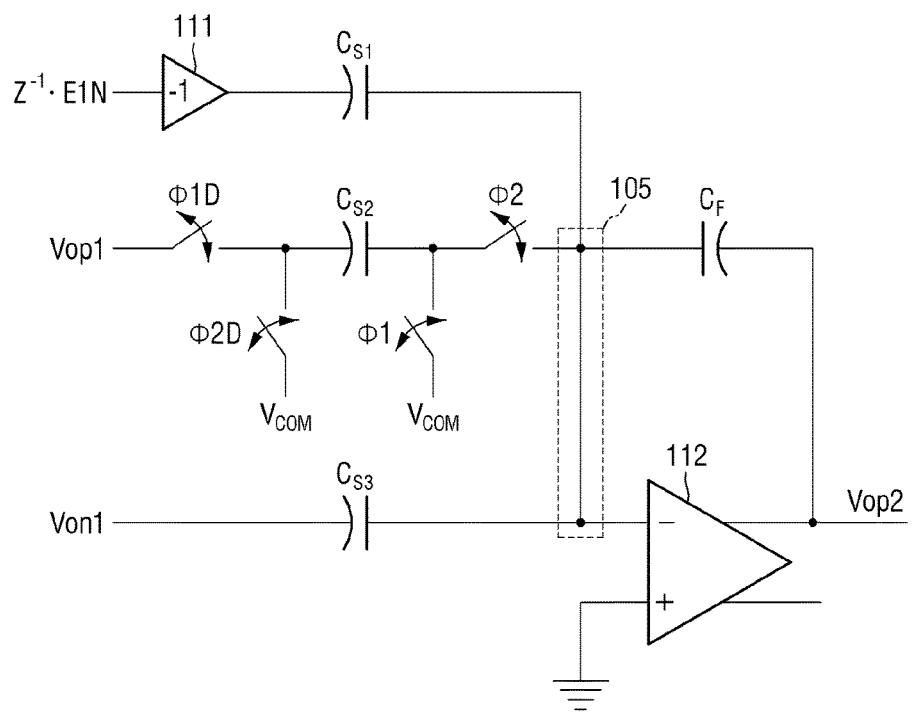
FIGS. 4, 5, 6 and 7 are various diagrams explaining in some additional detailed the operation of semiconductor device(s) according to embodiments of the inventive concept.

FIG. 4 is a circuit diagram further illustrating a switched capacitor (SC) network that may be used as the secondary integrator described above in the context of certain embodiments of the inventive concept. In this regard, a first path is provided in which $(Z^{-1}E_1N)$ is applied. A second path to which Vop1 is applied, and a third path to which Von1 3 is applied are connected to the first sub-node 105. Here, the first path corresponds to the output provided by the third filter 108 of FIG. 3 through an inverter 111, and the second path corresponds to the output of the first filter 103 of FIG. 3, and the third pass corresponds to the output of the second filter 104 of FIG. 3, where the second path and third path provide inputs to a differential amplifier 112 providing Vop2 as an output.

Figure 5:
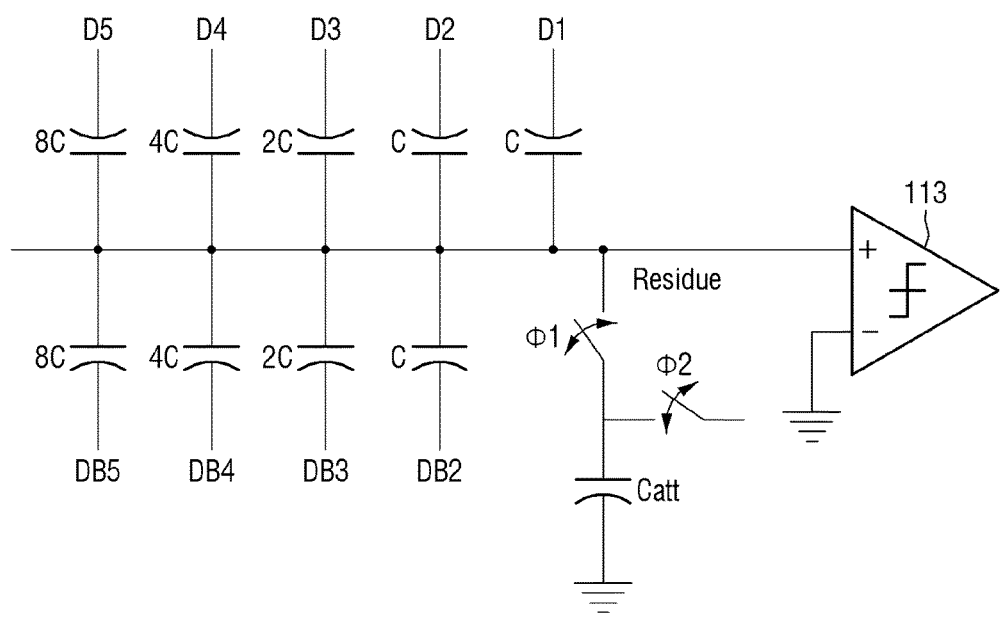
Figure 6:
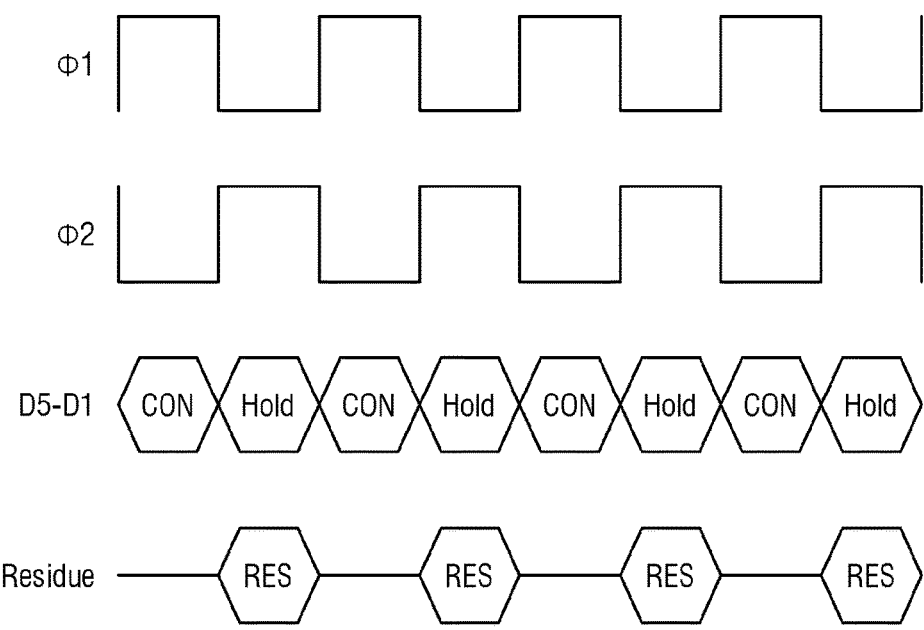
Figure 7:
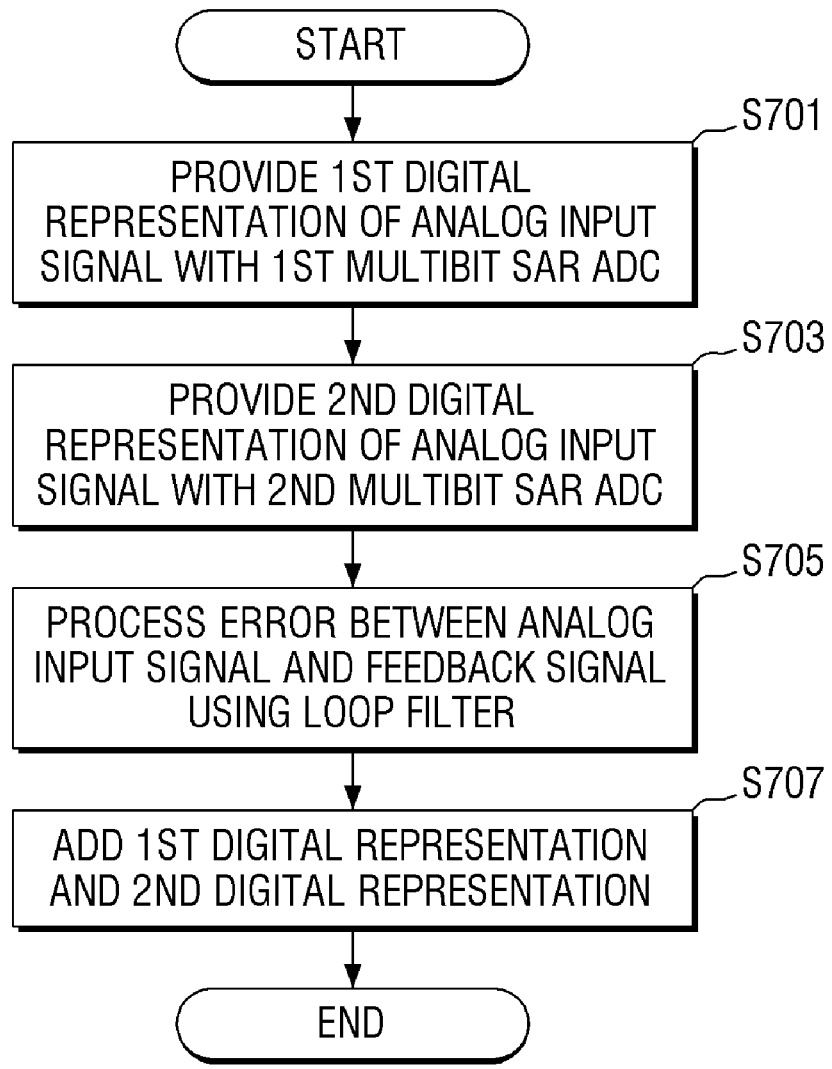

FIG. 5 is a circuit diagram illustrating an example wherein the first integrator 120 is provided as a multi-bit SAR ADC according to certain embodiments of the inventive concept. FIG. 6 is a timing diagram and FIG. 7 is a flow chart further describing the operation of the circuit of FIG. 5.

Referring collectively to FIGS. 1, 2, 3, 4, 5, 6 and 7, the first digital representation of the analog input signal IN having passed through the loop filter 100 is provided using the first ADC 120 (S701), where the first ADC 120 includes a multi-bit SAR ADC.

The second digital representation of the analog input signal is also provided using the second ADC 220 and differential amplifier 113 (S703).

An error between the analog input signal and the feedback signal provided by the DAC 140 is determined using the loop filter 100 (S705). Here, the second digital representation provided by the second ADC 220 may be added to the first digital representation provided by the first ADC 120 with the result being applied to the DAC 140 as an input generating the analog feedback signal.

The foregoing method the step (S705) may include the performing of the first integral operation on the output of the gain block 130 using the first integrator 102, the performing of each the first filter operation and second filter operation on the output of the first integrator 102 using, respectively, the first filter 103 and the second filter 104, performing of the add operation on the output of the first filter 103 and the output of the second filter 104 using the second sub-node 105, and the performing of the second integral operation on the output of the second sub-node 105 using the second integrator 120, and providing the resultant signal to the first ADC 120.

Alternately or additionally, the foregoing method step (S705) may further include the performing of the subtract operation on the output of the second integrator 120 and the output of the first ADC 120 using the second sub-node 107, the performing of the third filter operation on the output of the second sub-node 107 using the third filter 108, and the performing of the subtract operation on the output of the first filter 103, the output of the second filter 104, and the output of the third filter 108, using the first sub-node 105.

Further, the above method includes an addition of the first digital representation and the second digital representation (S707).

In some embodiments of the inventive concept, the method may further include the performing of a subtract operation on the analog input signal and the feedback signal at the first node 160.

Also, in some embodiments of the inventive concept, the method may further include the performing of a preset digital signal processing on the output of the second ADC 220 using the STF block 240.

Also, in some embodiments of the inventive concept, the above method may further include generation of the output of N-bits, where 'N' is a natural number, on the output of the STF block 240 and the output of the first ADC 120 to generate an input applied to the decimator 260.

According to the various embodiments of the inventive concept described so far, it is possible to provide an ADC having reduced power consumption and improved operational stability.

In particular, by providing the first ADC 120 as a multi-bit SAR ADC, there is an advantage in which it is not necessary to add an error compensation circuit due to the deviated LSB size. Furthermore, since the minimum value of the feedback signal of the delta-sigma modulator is not limited to the specific range, it is possible to improve the overall operational stability of the ADC.

Further, there is an advantage in which the "delta" value corresponding to the input of the delta-sigma modulator 10 is more finely expressed, and the variation of the voltage level of the circuit element including the integrator provided in the delta-sigma modulator 10 can be reduced and its stability can be improved, and furthermore, the filter performance can be improved, or the degree of freedom of selecting the filter coefficient can be enhanced.

Also, the delta-sigma modulator 10 can exhibit the tertiary filter characteristics, by providing the noise coupling path, using the residue of the first ADC 120 provided as the multi-bit SAR ADC, while adopting only the secondary integrator of the first integrator 102 and the second integrator 106.

In concluding the detailed description, those skilled in the art will appreciate that many variations and modifications can be made to the preferred embodiments without substantially departing from the principles of the inventive concept. Therefore, the disclosed preferred embodiments of the disclosure are used in a generic and descriptive sense only and not for purposes of limitation.

What is claimed is:

1. A semiconductor device comprising:
a loop filter that receives a differential analog signal and generates a residue signal indicating an error between an analog input signal and an feedback signal;
a first analog to digital converter (ADC) that receives the residue signal and generates a first digital representation;
a second ADC that receives the analog input signal and generates a second digital representation corresponding to the analog input signal; and
a digital to analog converter (DAC) that receives a sum of the first digital representation and the second digital representation and generates the analog feedback signal,
wherein the first ADC is a multi-bit Successive Approximation Register ADC using a first step voltage.

2. The semiconductor device of claim 1, wherein the second ADC is a multi-bit SAR ADC using a second step voltage less than or equal to the first step voltage.

3. The semiconductor device of claim 1, further comprising:
a first node that performs a subtraction operation between the analog input signal and the feedback signal to generate the differential analog signal.

4. The semiconductor device of claim 3, wherein the loop filter further comprises:

a gain block that receives the differential analog signal and performs a scaling operation on the differential analog signal to generate a scaled result;

a first integrator that receives the scaled result and performs a first integral operation on the scaled result to generate a first integrated result;

a first filter and a second filter that commonly receive the first integrated result, and respectively perform a first filter operation and a second filter operation;

first sub-node that adds an output of the first filter to an output of the second filter to generate a summation result; and a second integrator which receives an output of the second node, performs a second integral operation to generate a second integrated result, and provides the second integrated result to the first ADC.

5. The semiconductor device of claim 4, wherein the loop filter further comprises:

a second sub-node that performs a subtraction operation between the second integrated result and the first digital representation provided by the first ADC; and a third filter that receives an output signal of the second sub-node and performs a third filter operation, wherein the first sub-node performs a subtraction operation between an output of the third filter and the summation result.

6. The semiconductor device of claim 1, further comprising:

a Signal Transfer Function (STF) block that receives the second digital representation from the second ADC and performs a preset digital signal processing.

7. The semiconductor device of claim 6, further comprising:

a third node that adds an output of the STF block to the first digital representation from the first ADC.

8. The semiconductor device of claim 7, further comprising:

a decimator that receives an output of the third node to generates a final digital output having N-bits, where 'N' is a natural number.

9. The semiconductor device of claim 1, wherein the second ADC is a coarse ADC, and the first ADC is a fine ADC.

10. A semiconductor device comprising:

a first node that performs a subtract operation between an analog input signal and a feedback signal to generate a differential analog signal;

a second node that performs an addition operation on a first digital representation and a second digital representation;

a digital to analog converter (DAC) that generates the feedback signal from an output of the second node;

a gain block that performs an amplification operation on the differential analog signal;

a first integrator that performs a first integral operation on the amplified differential analog signal to generate a first integrated result;

a first filter that performs a first filter operation on the first integrated result, and a second filter that performs a second filter operation on the first integrated result;

a first sub-node node that performs an addition operation on an output of the first filter and an output of the second filter;

a second integrator that performs a second integral operation of an output of the first sub-node to generate a second integrated result; and a fine analog to digital converter (ADC) that generates the first digital representation from the second integral result.

11. The semiconductor device of claim 10, further comprising:

a coarse ADC that that generates the second digital representation from the analog input signal;

a Signal Transfer Function (STF) block that receives the second digital representation and performs a preset digital signal processing;

a third node performs an addition operation on an output of the STF block and the first digital representation; and a decimator that receives an output of the third node to generates a final digital output having N-bits, where 'N' is a natural number.

12. A method of operating a semiconductor device, the method comprising:

generating a residue signal indicating an error between an analog input signal and a feedback signal using a loop filter that receives a differential analog signal;

generating a first digital representation from the residue signal using a first analog to digital converter (ADC);

generating a second digital representation from the analog input signal using a second ADC; and generating the feedback signal using a digital to analog converter (DAC) that receives a sum of the first digital representation and the second digital representation, wherein the first ADC is a multi-bit Successive Approximation Register ADC using a first step voltage.

13. The method of claim 12, wherein the second ADC is a multi-bit SAR ADC using a second step voltage less than or equal to the first step voltage.

14. The method of claim 12, further comprising:

performing a subtraction operation at a first node between the analog input signal and the feedback signal to generate the differential analog signal.

15. The method of claim 14, further comprising:

performing a scaling operation on the differential analog signal using a gain block to generate a scaled result;

performing a first integral operation on the scaled result to generate a first integrated result using a first integrator;

performing a first filtering operation on the first integrated result using a first filter;

performing a second filtering operation on the first integrated result using a second filter;

adding an output of the first filter to an output of the second filter at a first sub-node to generate a summation result.

16. The method of claim 15, further comprising:

performing a subtraction operation between the second integrated result and the first digital representation at a second sub-node;

performing a third filter operation on an output of the second sub-node using a third filter; and performing a subtraction operation between a result of the third filter operation and the summation result.

17. The method of claim 12, further comprising:

performing a preset digital signal processing on the second digital representation using a Signal Transfer Function (STF) block.

18. The method of claim 17, further comprising:

adding an output of the STF block to the first digital representation at a third node.

19. The method of claim 18, further comprising:

generating a final digital output having N-bits, where 'N' is a natural number, from an output of the third node using a decimator.

20. The method of claim 12, wherein the second ADC is a coarse ADC, and the first ADC is a fine ADC.

* * * * *